(12) United States Patent
Gwinn et al.

(10) Patent No.: US 11,715,620 B2
(45) Date of Patent: Aug. 1, 2023

(54) TUNING GAS CLUSTER ION BEAM SYSTEMS

(71) Applicant: TEL Manufacturing and Engineering of America, Inc., Chaska, MN (US)

(72) Inventors: Matthew Gwinn, Winchendon, MA (US); Martin Tabat, Nashua, NH (US); Kenneth Regan, Beverly, MA (US)

(73) Assignee: TEL Manufacturing and Engineering of America, Inc., Chaska, MN (US)

( * ) Notice: Subject to any disclaimer, the term of this patent is extended or adjusted under 35 U.S.C. 154(b) by 108 days.

(21) Appl. No.: 17/493,210

(22) Filed: Oct. 4, 2021

(65) Prior Publication Data
US 2022/0359155 A1    Nov. 10, 2022

Related U.S. Application Data

(60) Provisional application No. 63/180,949, filed on Apr. 28, 2021.

(51) Int. Cl.
*H01J 37/304* (2006.01)
*G01N 15/02* (2006.01)
*H01J 37/244* (2006.01)

(52) U.S. Cl.
CPC ........ *H01J 37/304* (2013.01); *G01N 15/0266* (2013.01); *H01J 37/244* (2013.01)

(58) Field of Classification Search
CPC ...... H01J 37/304; H01J 37/244; H01J 27/026; H01J 2237/05; H01J 2237/0812; H01J 37/08; G01N 15/0266

See application file for complete search history.

(56) References Cited

U.S. PATENT DOCUMENTS

| | | | |
|---|---|---|---|
| 6,486,478 B1 * | 11/2002 | Libby | H01J 37/3053 204/192.1 |
| 6,737,643 B2 * | 5/2004 | Torti | H01J 49/10 427/523 |
| 6,770,874 B2 * | 8/2004 | Dykstra | H01J 37/304 250/492.2 |
| 6,831,272 B2 * | 12/2004 | Mack | C23C 14/221 250/257 |
| 8,097,860 B2 * | 1/2012 | Tabat | H01J 37/305 118/723 CB |
| 2001/0054686 A1 * | 12/2001 | Torti | H01J 49/0422 250/288 |
| 2002/0005676 A1 * | 1/2002 | Greer | H03H 3/10 310/313 R |

(Continued)

*Primary Examiner* — David A Vanore
(74) *Attorney, Agent, or Firm* — Slater Matsil, LLP

(57) ABSTRACT

A method for processing a substrate that includes: applying, at an ionizer, a drive pulse train to an ion source to ionize a gas cluster beam and transfer the drive pulse train to the gas cluster beam; measuring, at a detector exposed to the gas cluster beam, a beam current synchronously with the drive pulse train; obtaining time-of-flight information of the clusters and the monomers in the gas cluster beam based on the beam current and the drive pulse train; determining size information relating to a size distribution of clusters and monomers in the gas cluster ion beam based on the time-of-flight information; adjusting a process parameter of the gas cluster beam based on the size information; and exposing the substrate to the gas cluster beam with the adjusted process parameter.

20 Claims, 8 Drawing Sheets

(56) References Cited

U.S. PATENT DOCUMENTS

| | | | | |
|---|---|---|---|---|
| 2006/0043317 A1* | 3/2006 | Ono | ............... | H01J 37/3053 |
| | | | | 250/492.21 |
| 2006/0278611 A1* | 12/2006 | Sato | ............... | H01J 37/3244 |
| | | | | 156/345.39 |
| 2010/0096263 A1* | 4/2010 | Sato | ............... | H01J 37/08 |
| | | | | 204/298.36 |
| 2010/0193708 A1* | 8/2010 | Tabat | ............... | H01J 37/317 |
| | | | | 250/492.3 |
| 2011/0269619 A1* | 11/2011 | Verbeck | ............... | B82B 3/00 |
| | | | | 427/523 |
| 2012/0225532 A1* | 9/2012 | Hautala | ............... | C23C 14/548 |
| | | | | 257/E21.004 |
| 2014/0252225 A1* | 9/2014 | Iwasaki | ............... | H01J 49/40 |
| | | | | 250/288 |
| 2015/0206732 A1* | 7/2015 | Sakai | ............... | H01J 49/165 |
| | | | | 250/288 |
| 2019/0355542 A1* | 11/2019 | Choi | ............... | H01J 37/08 |

* cited by examiner

TUNING GAS CLUSTER ION BEAM SYSTEMS

CROSS-REFERENCE TO RELATED APPLICATIONS

This application claims the benefit of U.S. Provisional Application No. 63/180,949, filed on Apr. 28, 2021, which application is hereby incorporated herein by reference.

TECHNICAL FIELD

The present invention relates generally to a system and method of processing a substrate with ion beam, and, in particular embodiments, to a system and method for tuning gas cluster ion beam systems.

BACKGROUND

In fabrication of microelectronic devices, surface planarization processes for materials such as semiconductors, dielectrics, and metals has to achieve a high figure of merit for the device performance. Particularly in semiconductor manufacturing, planarization may be achieved by etching under vacuum conditions, i.e., dry etch, such as ion-beam and plasma etching. However, as the requirement for smoothness in microelectronic and photonic device components has been approaching to atomic scales, the current industrial techniques have a shrinking room for improvements.

Gas cluster ion beam (GCIB) processing is a powerful tool to offer advantages in surface modification and has been used for etching, cleaning, and smoothing of the surfaces of various materials. Some example applications include etching in semiconductor fabrication, trimming during surface wave acoustic (SAW) device manufacturing for radio frequency (RF) filters, and ion sources for analytical depth-profiling by secondary ion mass spectrometry (SIMS) and x-ray photoelectron spectroscopy (XPS). Furthermore, in addition to removal of material and smoothing, GCIB has also been applied for thin film formation, surface oxidation of interdigital transducer, and semiconductor doping.

In a GCIB process, electrically accelerated clustered ions of gaseous atoms or molecules strike a substrate as a beam, and the bombardment will remove, modify, or smoothen the surface layers of the substrate. Typically, a cluster has some thousands of atoms or molecules, loosely bound by van der Waals forces. In the following, the term "molecule" is used to collectively refer to a molecule or single atom (e.g., argon) for the purpose of description. While a cluster as a whole may have an energy of tens of keV, each molecule constituting the cluster has a low energy of only several eV. In contrast, however, each molecule energized in the conventional ion beam techniques has a much higher energy (e.g., tens of keV). Having a low energy per molecule, GCIB may offer unique features in surface processing such as low damage, low thermal load, and shallow impact on the surface and lateral sputtering that enable surface smoothing.

SUMMARY

In accordance with an embodiment of the present invention, a method for processing a substrate that includes: passing a gas cluster beam through an ionizer, the ionizer having a first operating state in which the ionizer is turned ON to ionize the passing gas cluster beam and a second operating state in which the ionizer is turned OFF, the gas cluster beam including a distribution of clusters of different sizes and monomers; exposing a detector to the gas cluster beam; measuring a beam current at the detector while changing an operating state of the ionizer; obtaining time-of-flight information of the clusters and the monomers in the gas cluster beam based on the beam current and a timing of the changing of the operating state of the ionizer; obtaining size information relating to a size distribution of the clusters and the monomers in the gas cluster beam based on the time-of-flight information; adjusting a process parameter of the gas cluster beam based on the size information; and exposing the substrate to the gas cluster beam with the adjusted process parameter.

In accordance with an embodiment of the present invention, a method for processing a substrate that includes: applying, at an ionizer, a drive pulse train to an ion source to ionize a gas cluster beam and transfer the drive pulse train to the gas cluster beam; measuring, at a detector exposed to the gas cluster beam, a beam current synchronously with the drive pulse train; obtaining time-of-flight information of the clusters and the monomers in the gas cluster beam based on the beam current and the drive pulse train; determining size information relating to a size distribution of clusters and monomers in the gas cluster ion beam based on the time-of-flight information; adjusting a process parameter of the gas cluster beam based on the size information; and exposing the substrate to the gas cluster beam with the adjusted process parameter.

In accordance with an embodiment of the present invention, an exemplary apparatus including: a source chamber having a beam-line for forming a gas cluster beam; an ionization/acceleration chamber including an ionizer configured to ionize the gas cluster beam and operate in a first operating state in which the ionizer is turned ON and a second operating state in which the ionizer is turned OFF, the gas cluster beam including a distribution of clusters of different sizes and monomers; a process chamber including a holder for holding a detector on the beam-line and expose the detector to the gas cluster beam and a current sensor to measure a beam current generated by the gas cluster beam at the detector while changing an operating state of the ionizer; a processor; and a non-transitory memory storing a program to be executed in the processor, the program including instructions to obtain size information relating to a size distribution of the clusters and the monomers in the gas cluster beam based on the beam current and a timing of the changing of the operating state of the ionizer, and adjust a process parameter of the gas cluster beam based on the size information.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A-4C illustrate the relationship between cluster size distribution (CSD) and beam current decay or rise, wherein FIG. 4A illustrates a model CSD, FIG. 4B illustrates the corresponding model beam current decay and rise, and wherein FIG. 4C illustrates a schematic data of an example operation of GCIB with a pulse train driving the ionizer in accordance with an embodiment;

DETAILED DESCRIPTION OF ILLUSTRATIVE EMBODIMENTS

In various embodiments, this disclosure describes an apparatus and methods for GCIB processing.

The effect of GCIB processing is generally determined by factors such as the beam flux, cluster size distribution (CSD), and reactivity of gas clusters. These factors generally depend on parameters such as the nozzle injection process generating the clusters, the plasma process generating the ions, the type of molecules in the beam, the acceleration voltage for the ions among others. When a beam is generated to have a narrow or tighter cluster size distribution (CSD), the charge to mass ratio of the beam is more uniform causing the energy of the particles impinging at the surface of the substrate to be also more uniform, resulting in a controlled GCIB process. However, presently available GCIB equipment produces clusters with a wide CSD, which consequently contains small ions such as monomers, dimers, trimmers, and the like. These lower mass particles are undesirable because their higher charge to mass ratio causes them to accelerate to higher energies. Thus, the energy of particles impinging at the surface of the substrate for a wider CSD also has a larger variation. Therefore, conventionally, costly magnetic filters are installed in GCIB systems to deflect and eliminate these small ions. However, the magnets become more expensive with size. Such size filtering also inevitably sacrifices a portion of beam flux. Furthermore, conventional methods for presently available GCIB equipment are typically unable to provide information on CSD, preventing a user to adjust process parameters judiciously, especially in real-time. With these limitations, it may be highly desirable to develop a method for adjusting CSD not relying on a filter.

The apparatus and methods described in this disclosure provide a feedback loop to determine the CSD based on monitoring the beam current and calculating the time of flight (TOF) of clusters and monomers. Based on the methods of various embodiments, it may be possible to alleviate the dependence on the aforementioned magnetic filters and reduce the cost of GCIB equipment in various applications. Eliminating or minimizing the magnetic filters may save space in the GCIB equipment. Additionally, embodiments of this invention may lead to enhanced throughput rate and reduction of the beam length.

Figure 5:
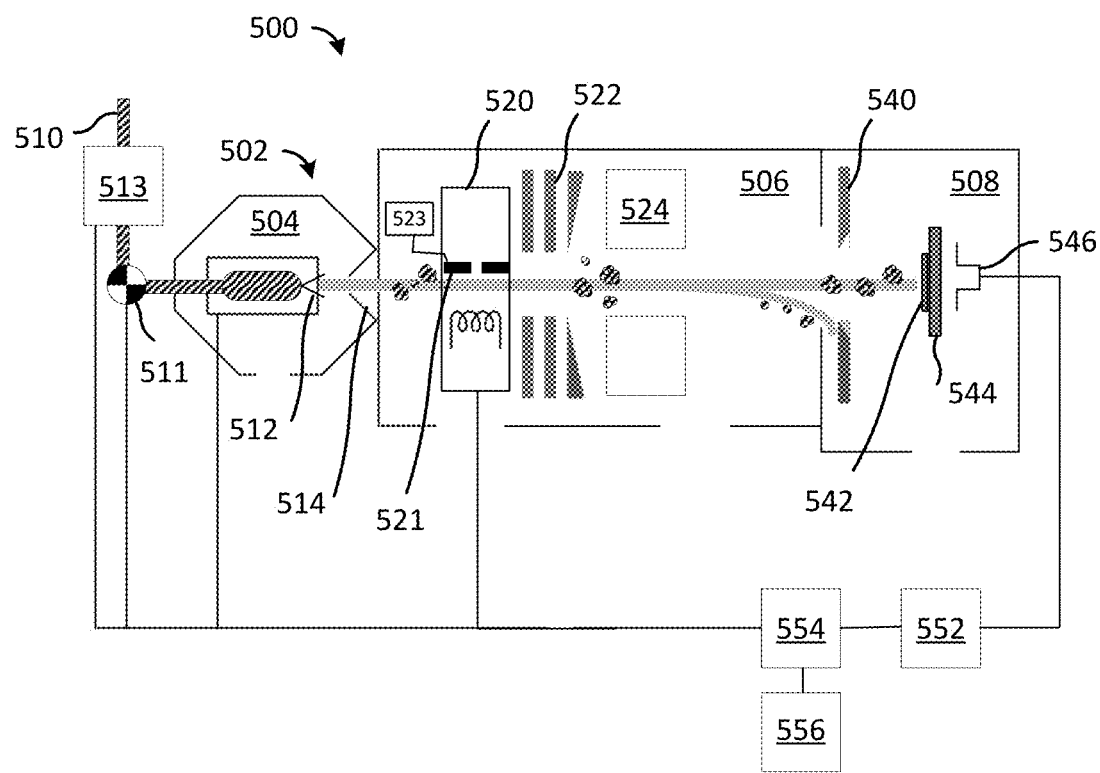
FIG. 5 illustrates a gas cluster ion beam processing system in accordance with an embodiment.
Figure 6A:
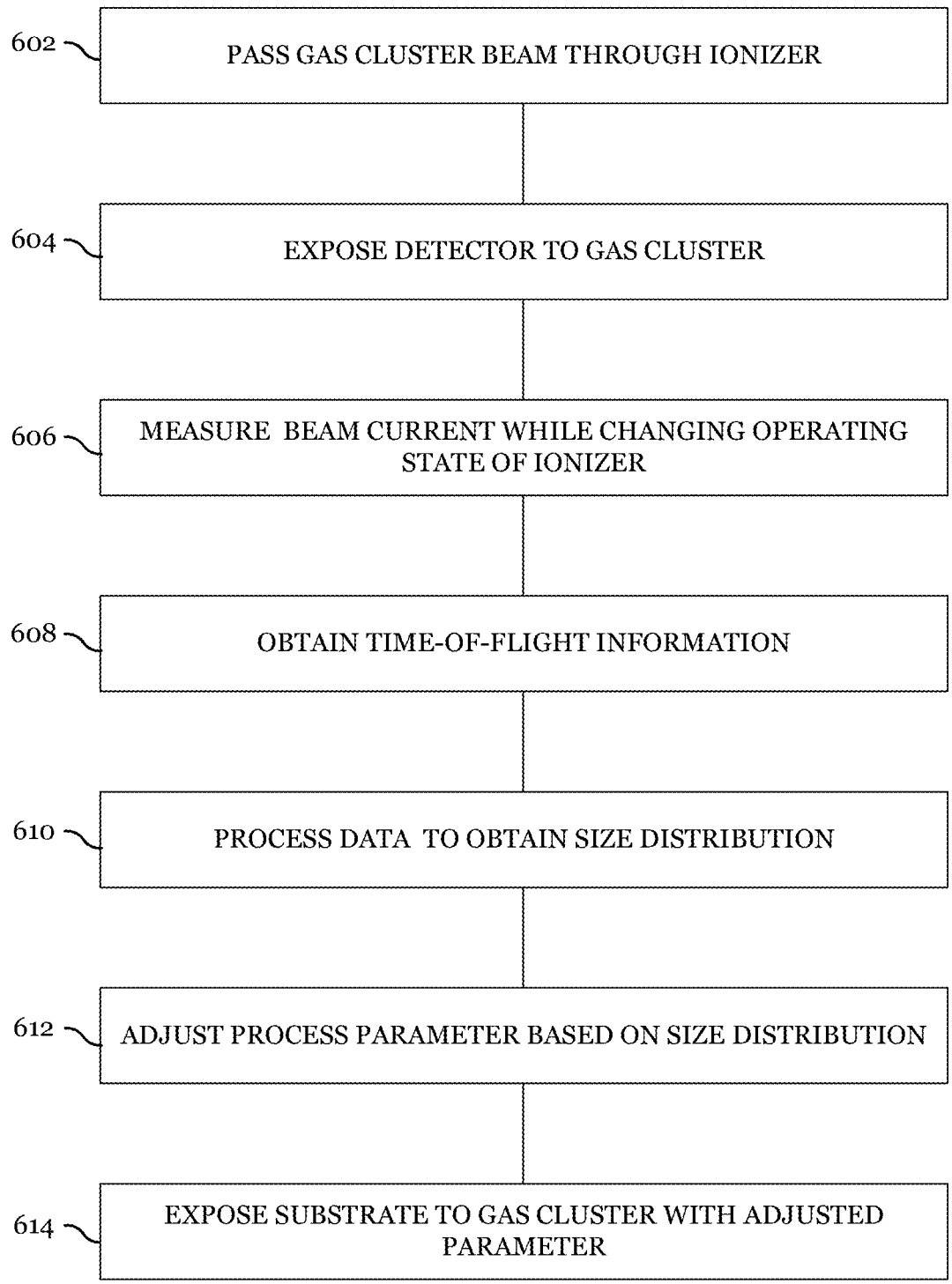
FIG. 6A illustrates a method of processing a substrate in accordance with an embodiment of this disclosure.
Figure 6B:
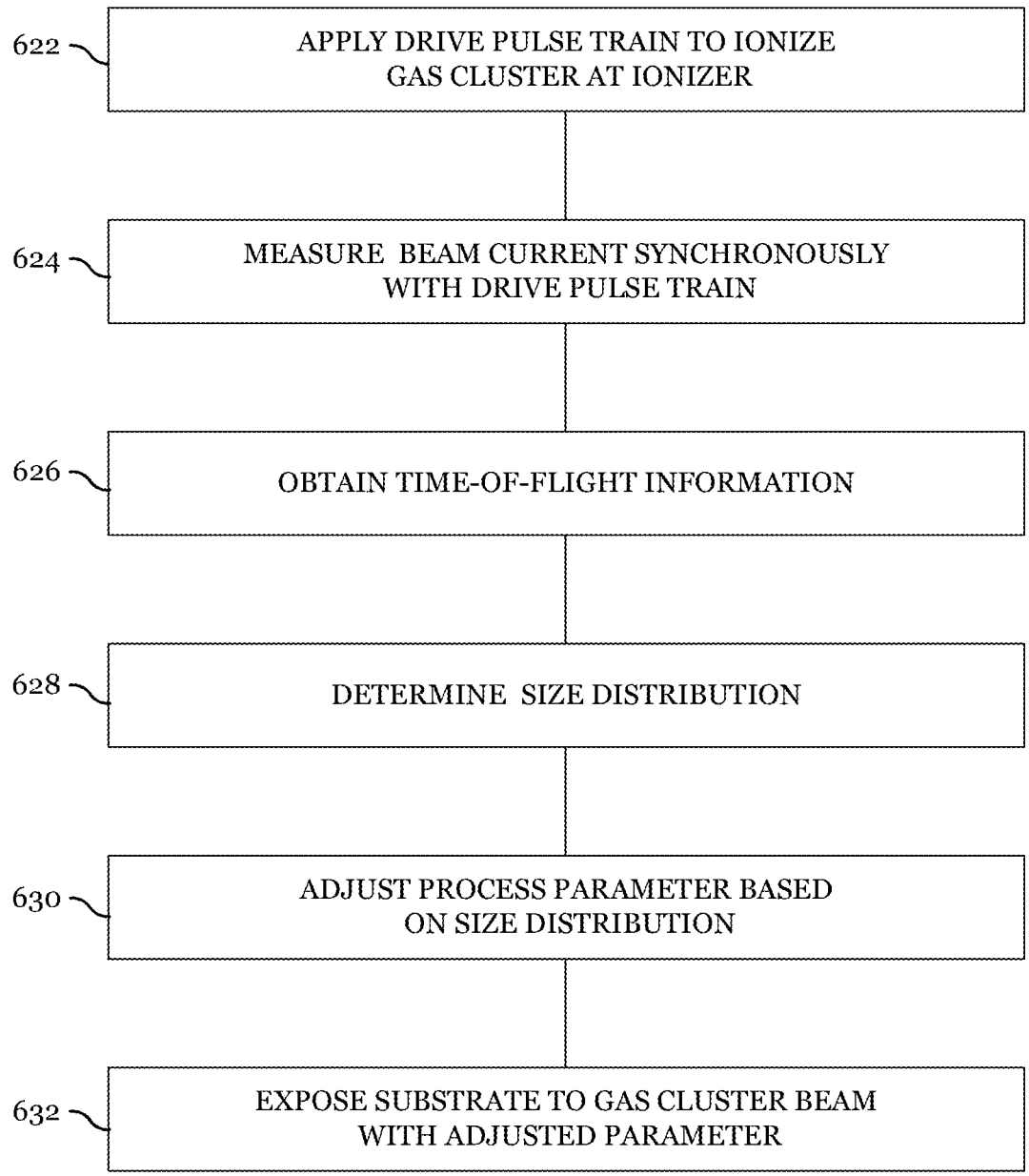
FIG. 6B illustrates an alternate method of processing a substrate in accordance with an embodiment of this disclosure.

In the following, the flow of GCIB processing including a feedback loop according to various embodiments is first introduced with reference to FIG. 1. The feedback loop is explained in more detail using FIGS. 2-4C. An embodiment GCIB processing tool to realize the method of this disclosure is illustrated in FIG. 5. Various methods of the feedback process in accordance with different embodiments are illustrated in FIGS. 6A-6B.

Figure 1:
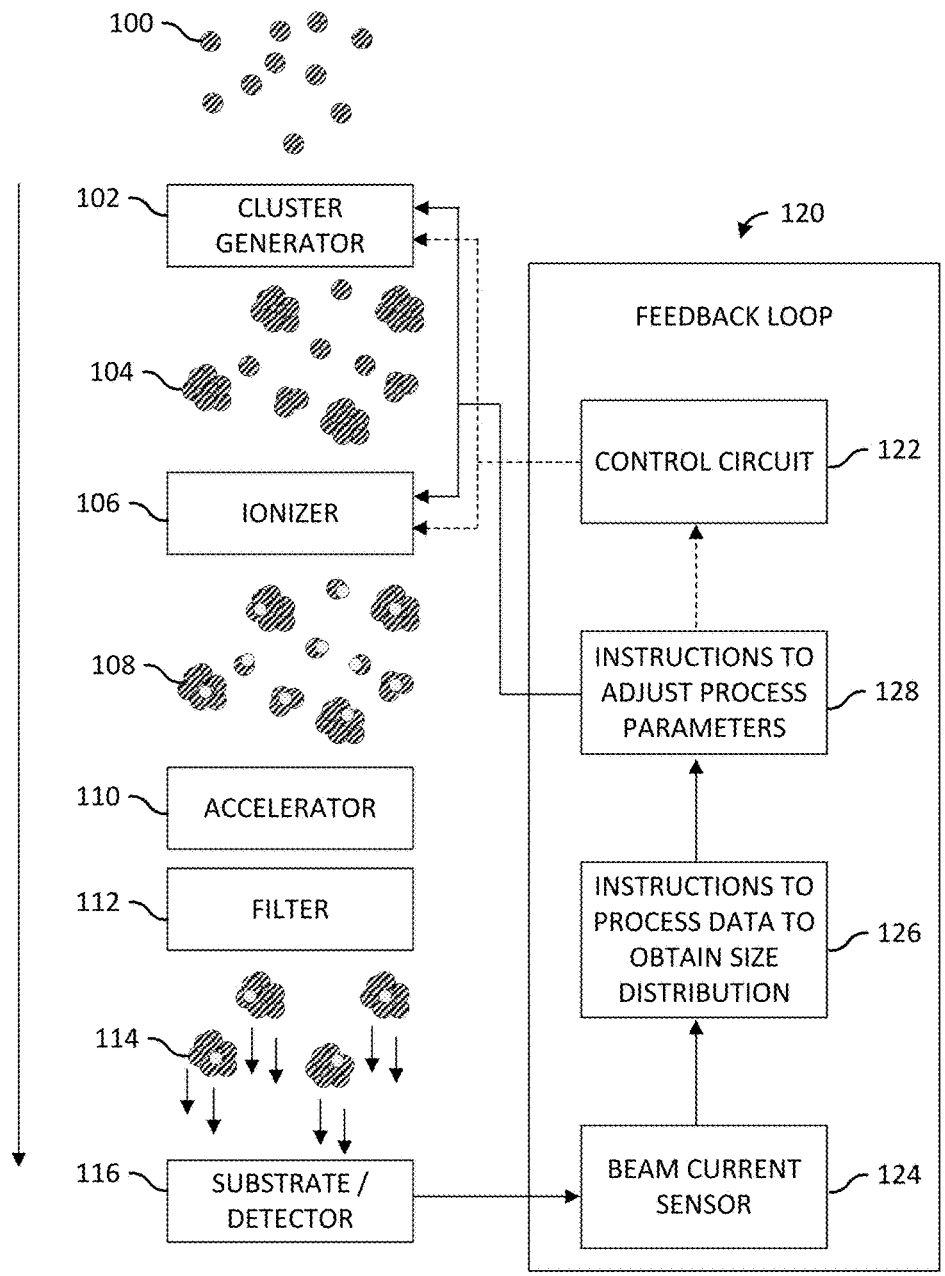
FIG. 1 illustrates a flow diagram of GCIB process with a feedback loop in accordance with an embodiment.

FIG. 1 illustrates a flow diagram of GCIB process with a feedback process is illustrated in accordance with an embodiment.

GCIB processing is a surface processing technique where a surface of a substrate is exposed to a highly collimated beam of high energy gas clustered ions.

As illustrated in FIG. 1, a gas stream of single molecules 100 may be introduced to the system in the form of monomers. In various embodiments, the gas used for GCIB processing may comprise inert gases such as helium (He), neon (Ne), argon (Ar), krypton (Kr), xenon (Xe), and nitrogen ($N_2$), reactive gases such as $O_2$, $CO_2$, $NH_3$, $NF_3$, $SF_6$, $CF_4$, $CHF_3$, the like, or a mixture of thereof. In one embodiment, the gas is argon.

As next illustrated in box 102, the monomers are converted to gas clusters in a cluster generator. In one embodiment, this may be performed by passing a gas stream through one or more nozzles to induce condensation, which will be described in more detail with respect to FIG. 5. Gas clusters for GCIB processing comprise aggregates ranging from a few to several thousand molecules loosely bound by van der Waals forces. In the following discussion, N is defined as the number of molecules in each cluster. Gas clusters may be formed by condensation induced by adiabatic expansion of a gas when passing through a supersonic nozzle; for example, by releasing a compressed gas (e.g., at about $10^4$ Torr) to a vacuum (e.g., about $10^{-1}$ Torr). Cluster formation is also illustrated in FIG. 1, wherein a portion of the single molecules 100 are condensed into clusters 104. In this block, each gas cluster may have several thousands to around ten thousands molecules. As discussed further in detail in later sections, gas clusters may be formed with a wide cluster size distribution (CSD) from small to large, including monomers (N=1) that are not condensed. However, as will be clear from the descriptions below, in various embodiments, the cluster size distribution of the gas clusters is controlled to be narrower.

Next, the gas clusters formed in the step above are ionized (box 106) to form a gas cluster ion beam (GCIB) in an ionizer, which will be described in more detail with respect to FIG. 5. The ionizing may be performed in high vacuum (e.g., about $10^{-5}$ Torr). Thus each cluster attains a charge after this process. In various embodiments, the charge to mass ratio of the clusters has a narrow distribution because of the tighter CSD of the beam.

The GCIB is then accelerated (block 110) by one or more accelerators that provide a set amount of energy typically between 1 keV and several tens of keV. It should be noted that because each cluster having the same charge is given the same amount of energy by the accelerators, clusters with different sizes and therefore masses travel at different velocities.

Size filtering (block 112) may be performed next in a filter, for example, by passing the charged particular through a magnetic field. Size filtering eliminates a portion of charged gas clusters from the GCIB according to their size, resulting in the GCIB with little to no small clusters (block 114). If the cluster size distribution is narrow or well controlled, size filtering may be bypassed in some embodiments.

A bombardment occurs when the filtered GCIB strikes a surface of a substrate (block 116). The gas clusters disintegrate and deliver most of the kinetic energy toward modifying the substrate physically and/or chemically. Although each cluster has high energy (e.g., about 30 keV to 80 keV), the energy per molecule is low at around a few eV; therefore the molecules in the GCIB are generally stopped within about a few nanometers (e.g., less than 10 nm) from the surface. On the other hand, for example, a single molecule ion if present in the beam may have energies in the range of tens of keV and therefore can easily penetrate deeply into a substrate (many tens of nm to around 100 nm) and may cause uncontrolled damage to the substrate.

The substrate to be processed may be a semiconductor wafer, glass substrate, ceramic substrate, a piezoelectric substrate, a flat panel display, a liquid crystal display, or any other devices or materials. In various embodiments of this disclosure, the substrate may include any material portion or structure of a device or substrate and combinations thereof, thus not limited to any particular base structure, underlying layer or overlying layer, patterned or un-patterned.

In various embodiments, a substrate and a detector may be separate entities. The GCIB processing may include a calibration phase prior to the processing of the substrate to be processed. In such embodiments, during the calibration phase a detector, for example, a conductive plate such as a Faraday Cup may replace the substrate. The detector is designed to accurately capture the ionic charge from the GCIB to obtain accurate beam current measurements. Further, in certain embodiments, after the initial accurate calibration, ongoing monitoring of the process may be performed dynamically with a conductive detector positioned behind the substrate. In one embodiment, the detector may be fixed in a position behind the substrate, and an ongoing monitoring may be performed by scanning the substrate farther than the beam spot size so that the beam strikes the detector. The substrate may or may not be conductive.

During the bombardment, the charge in the ion is transferred to the substrate, which can be measured as a beam current. Furthermore, this feature of low charge-to-mass ratio allows for GCIB processing with a low beam current (e.g., about 0.1 mA to about 0.5 mA). The low beam current provides the advantages of avoiding undesirable surface charging and substrate heating. In certain embodiments, the average power is kept between less than about 1 W and about 5 W.

In various embodiments, GCIB processing in this disclosure further comprise a feedback loop 120. The feedback loop 120 comprises a beam current sensor to perform beam current measurement (block 124), instructions that when executed in a processor determine a contemporaneous cluster size distribution (CSD) (block 126), and instructions for determining process parameters to be adjusted and a magnitude of adjustment of the process parameter (block 128).

In addition, the feedback loop 120 may include a control circuit to control the GCIB operation. In certain embodiments, the instructions to adjust the process parameters may be sent directly to the different subunits of the GCIB tool or to the control circuit, which then may send command signals to the individual subunits. In some embodiments, the control circuit dynamically switches the operating state of the ionizer (block 122), which determines the start and end time of the ion beam. The ionizer may have two distinct operating states: one state in which the ionizer is ON and the other state in which the ionizer is OFF. While the embodiments of this invention describe methods in which the two operating states are ON and OFF, the method is not limited to exclude other intermediate states, for example, of high- and low-ionization power. A change between any two operating states of the ionizer may be used as long as it causes a response in the beam current. Moreover, a person having ordinary skill in the art may readily extend the embodiments to include multiple operating states.

The methods of various embodiments in this disclosure start with changing the operating state of the ionizer, for example from the ON to OFF state, and measuring the resulting change in beam current at the detector. This beam current information contains time-of-flight (TOF) information, which is the time taken for a particular ion to move from the ionizer to the substrate. This TOF information may be processed to extract the CSD information. Based on the extracted CSD information, the process parameters for cluster generation in box 102 and/or ionizer in box 106 may be adjusted. The basis for these methods is described more in detail below.

Figure 2:
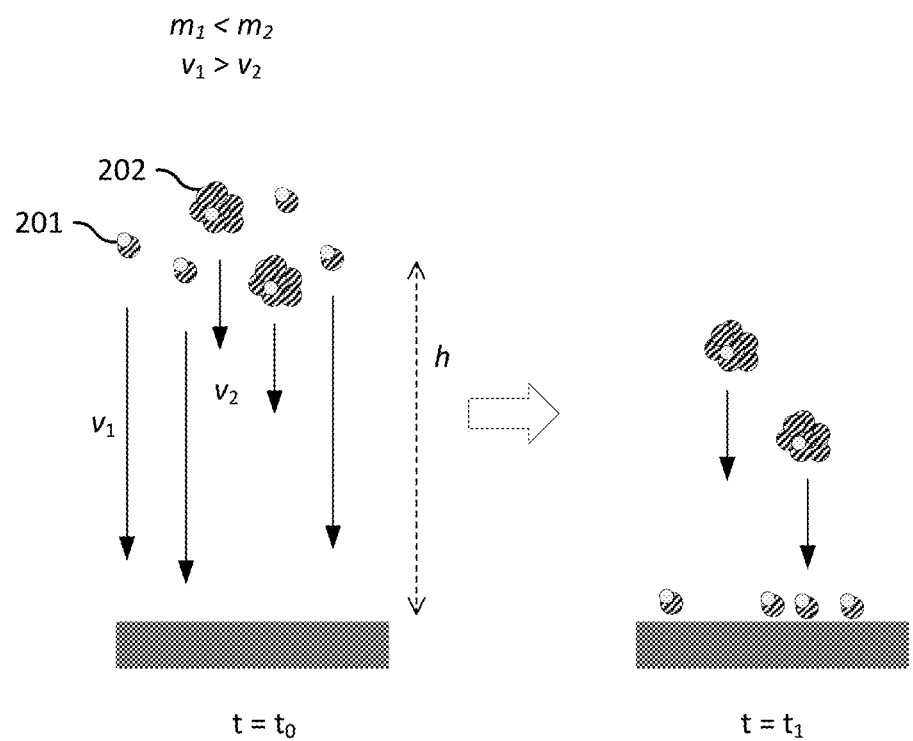
FIG. 2 illustrates the difference in time-of-flight of two model gas clusters with different sizes in accordance with an embodiment.
Figure 3:
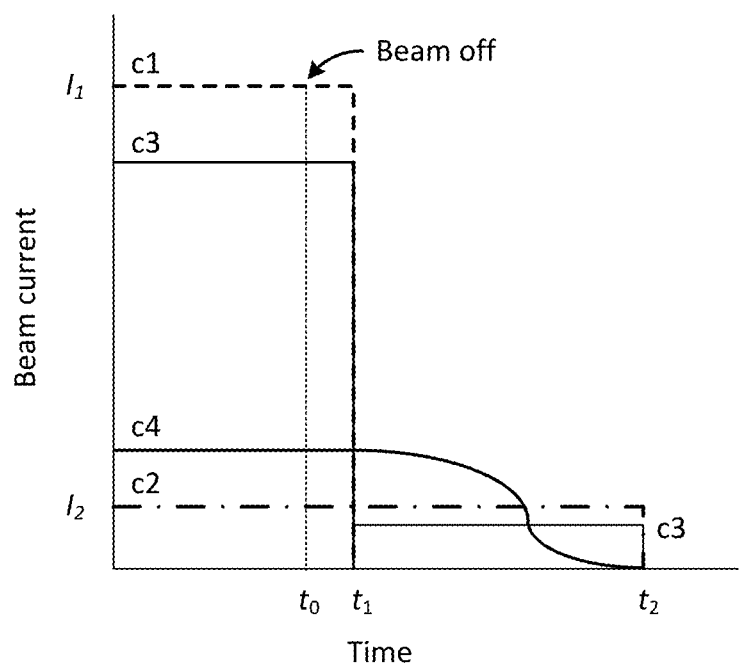
FIG. 3 illustrates the beam current decay for two model gas clusters with different sizes in accordance with an embodiment.

Referring to FIGS. 2, 3 and 4, the relationship between a beam current, a cluster size distribution (CSD), and their TOF in a GCIB is described using simplified models. First, as illustrated in FIG. 2, two model clusters with small (201) and large (202) size comprising of the same kind of molecule (e.g., Ar), with equal positive charges, are considered. In ionization of gas clusters, there may be variation in charge per cluster. For discussion, however, each cluster is assumed to have the elementary charge e ($\approx 1.602 \times 10^{-19}$ C) after ionization. The mass $m_i$ of a cluster i in the unit of kilogram may be described as $$m_i = \frac{A_r \times N_i}{1000 \times N_A},$$

where Ar is standard atomic weight or molecular weight, $N_i$ is the number of molecules per cluster or particle, and $N_A$ is Avogadro's constant ($\approx 6.022 \times 10^{23}$ mol$^{-1}$). The mass of a cluster $m_i$ is proportional to the number of molecules $N_i$.

At $t=t_0$, the clusters are assumed equally distanced from the surface at a height h, and assuming have the same charge are accelerated with a same kinetic energy per cluster $E_k$. Here, the kinetic energy $E_k$ of a cluster i is related to the mass $m_i$ and velocity $v_i$ as follows:

$$E_k = \tfrac{1}{2} m_i v_i^2$$

Here, representing the small model cluster 201 with i=1 and the large model cluster 202 with i=2, which both have the same kinetic energy, $$E_k = \tfrac{1}{2} m_1 v_1^2 = \tfrac{1}{2} m_2 v_2^2$$

Rearranging this equation gives the relationship between the mass and velocity of the two model clusters as follows:

$$\frac{v_2}{v_1} = \sqrt{\frac{m_1}{m_2}}$$

The equation above shows the inverse relationship between the mass and velocity. Since the mass of the larger model cluster 202 is greater than the mass of the small model cluster 201 (i.e., $m_2 > m_1$) in this example, the small clusters 201 travel with a velocity greater than that of the large clusters 202.

Still referring to FIG. 2, at $t=t_1$, when the small clusters 201 reach the surface, the large clusters 202 have not arrived at the surface, illustrating that the large clusters 202 have a longer TOF. In other words, in general, larger clusters 202 take a longer time to carry the same amount of charge. This may be expressed in the following equations using time $t_i$ required to travel the distance h as follows.

$$t_i = \frac{h}{v_i}$$

$$\frac{t_2}{t_1} = \frac{v_1}{v_2} = \sqrt{\frac{m_2}{m_1}}$$

For example, in the case where $N_1=2$ and $N_2=1000$, $m_2/m_1$ is 500 and $t_2/t_1$ is calculated as around 22.4. The distance h is a distance over which accurate time to travel can be measured, for example, between the ionizer and the substrate/detector as further described in FIG. 3. This analysis demonstrates the dependence of TOF on the gas cluster size.

FIG. 3 schematically illustrates the relationship between time-of-flight (TOF) and the corresponding beam current in a GCIB process in the case of changing the operating state of the ionizer from ON to OFF in accordance with an embodiment.

First curve c1 illustrates a schematic of a beam current measured for an exemplary ion beam made with only monomers, e.g., a conventional ion beam containing ionized atoms (not a gas cluster ion beam). In such an ion beam, turning OFF the ionizing current of the ionizer has a fast reaction on the beam current. In the illustration, until a first time ($t_0$), at a steady state with the ionizer ON, a stable beam current is being generated. Depending on the beam flux, the magnitude of the initial beam current level may vary.

In consideration of the same example discussed in FIG. 2, the initial current $I_1$ of the first curve c1 with monomers is higher than $I_2$ of the second curve c2 with large clusters of one fixed size. When the ionizer is turned off, the ionization and thereby the generation of GCIB is interrupted. However, the remaining ionized clusters in the chamber still continue to travel to the surface carrying the charges, maintaining the same velocity, until they are completely depleted and the current becomes zero. The charges carried with this last portion of ion beam constitutes the beam current decay after the GCIB shut-off ($t=t_0$). Due to the difference in mass and resulting velocity, large clusters take a longer time to reach the substrate (i.e., $t_2>t_1$).

If the GCIB contains two sizes, i.e., monomers and clusters of a fixed large size, the resulting decay is schematically shown in the third curve c3. The third curve c3 has features from the first curve c1 and the second curve c2 but the magnitudes may be different because the magnitude depends on the number of ions that are monomers versus the number of ions that are clusters.

In reality, when the GCIB contains a distribution of clusters of varying sizes along with monomers, the beam current follows the fourth curve c4. The decay is a function of TOF distribution, and with a fixed beam-line length in the system, it depends primarily on the cluster size distribution (CSD). Accordingly, changing the operating state of the ionizer and measuring the time t and current after the ionizer turn-off ($t=t_0$) allows the determination of the mass and abundance of corresponding clusters. The mass $m_i$ can be expressed as follows:

$$m_i = \frac{2E_k}{v_i^2} = 2E_k\left(\frac{t_i}{h}\right)^2$$

where h [m] is the beam-line length. The number of molecules $N_i$ may be further derived based on $$m_i = \frac{A_r \times N_i}{1000 \times N_A}, \quad N_i = \frac{1000 \times N_A}{A_r}m_i = \frac{2000 \times N_A \times E_k}{A_r}\left(\frac{t_i}{h}\right)^2$$

In GCIB processing, acceleration voltage is a process variable and it primarily determines the kinetic energy $E_k$ given to gas clusters. For example, in a case of experiment where the beam-line length h is 0.75 m, argon is used for gas clusters ($A_r \approx 39.95$), and the acceleration energy is 30 keV ($\approx 4.81 \times 10^{-15}$ J), if the t measured is $1 \times 10^{-4}$ sec, $N_i$ is determined to be approximately 2580.

Instead of focusing on the beam current decay in response to the ionizer being turned OFF, time-of-flight (TOF) may also be calculated based on the beam current rise in response to the ionizer being turned ON (i.e., the operating state changes from OFF to ON). The same principle described above may be applied, with the assumption that a stable stream of uncharged gas clusters without ionization is established first. Prior to ionization, there is a flux of gas clusters but carrying no charge, and therefore no beam current is expected. When the ionization is initiated by the ionizer, the charged clusters are formed and start to travel to the surface of the substrate while being accelerated by acceleration voltage. Since the velocity of a cluster is inversely related to its mass, small clusters result in shorter rise time while large clusters in longer rise time. Analyzing the beam current rise therefore provides the TOF information, reflecting the CSD of GCIB.

In alternate embodiments, a drive pulse train may be used for activation and deactivation of the ionizer. In response to a drive pulse that triggers an ON/OFF of the ionizer, the beam current may be measured and analyzed to obtain the TOF information, for example, using both beam current rise and decay. In further embodiments, when a pulse train comprising a plurality of pulses drives the ionizer, the beam current data from a subset of periodic pulses may be super-imposed over a time period before computing the TOF data. This may enable to improve the signal-to-noise ratio in the resulting beam current data.

Accordingly, in various embodiments, the TOF calculation may be conducted using the beam current decay, the beam current rise, or both. In further embodiments, a plurality of these beam current changes may be used by the feedback loop before adjusting process parameters.

Figure 4A:
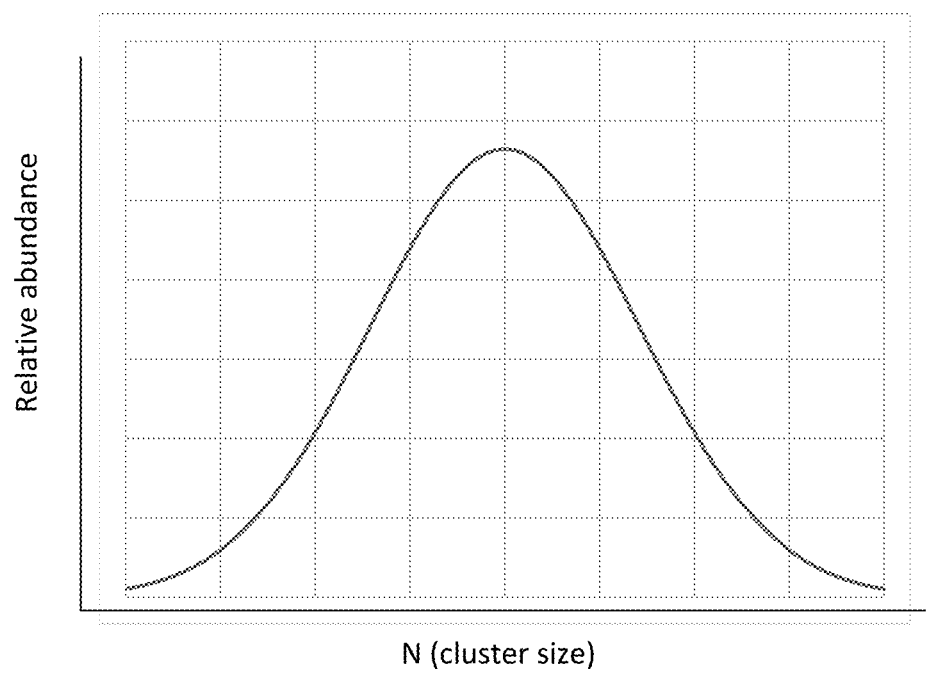
Figure 4B:
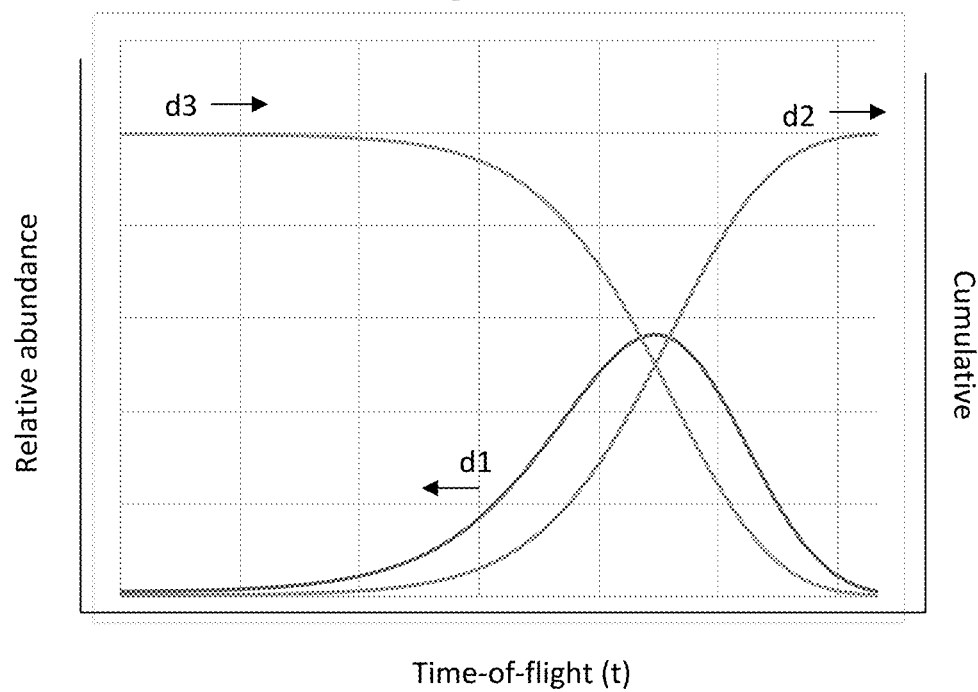

FIGS. 4A and 4B describe the relationship of cluster size distribution (CSD) and beam current using a model size distribution having a Gaussian distribution.

Referring to FIG. 4A, the x-axis represents the cluster size and the y-axis represents the relative abundance. The cluster size is proportional to the number of molecules, N. Based on the discussion in previous sections, the following relationship is established:

$$N \propto m \propto t^2$$

With the assumption of the same kinetic energy per cluster, the number of molecules N is proportional to the square of TOF, t.

FIG. 4B schematically illustrates the distribution, when the x-axis of FIG. 4A is replaced with $t^2$ and replotted against a new x-axis of t. The relative abundance d1 is obtained, reflecting the TOF distribution that corresponds to the model CSD in FIG. 4A. Note that the peak and distribution in the relative abundance d1 is shifted from FIG. 4A because of the new x-axis. Integrating the relative abundance d1 in FIG. 4B provides the cumulative distribution function d2 of TOF (not-to-scale). This cumulative distribution function d2 in FIG. 4B represents the ratio of clusters with TOF below a given time t. This may be further interpreted as the ratio of charges carried by those clusters because the charge per cluster is assumed to be consistent.

On the other hand, in consideration of beam current, at a given time x, the beam current detector receives the charges from clusters of different sizes traveling for different times. The total charges arriving at the detector at a given time x constitutes the instantaneous beam current at the time x. In the case of the ionizer being turned ON, during the rise of beam current, this total charge is proportional to the cumulative amount of charges carried by the clusters with TOF below x. Therefore, the cumulative distribution function d2 in FIG. 4B represents the beam current rise in response to the ionizer being tuned ON. Similarly, the beam current decay in response to the ionizer being turned OFF may be represented by another function d3, which is defined as 1−d2.

Performing the operation above in the reverse order, a cluster size distribution (CSD) may be obtained from the measurement of a beam current in response to the change in operating state of the ionizer. In other words, according to the methods of GCIB processing in this disclosure, the ionizer can be toggled to change the operating state, and a resulting beam current decay, rise, or both may be measured experimentally. Next, the time derivative of beam current may be calculated with the use of a processor. This time derivative represents the TOF distribution. Based on this TOF distribution, the corresponding CSD may be obtained.

Figure 4C:
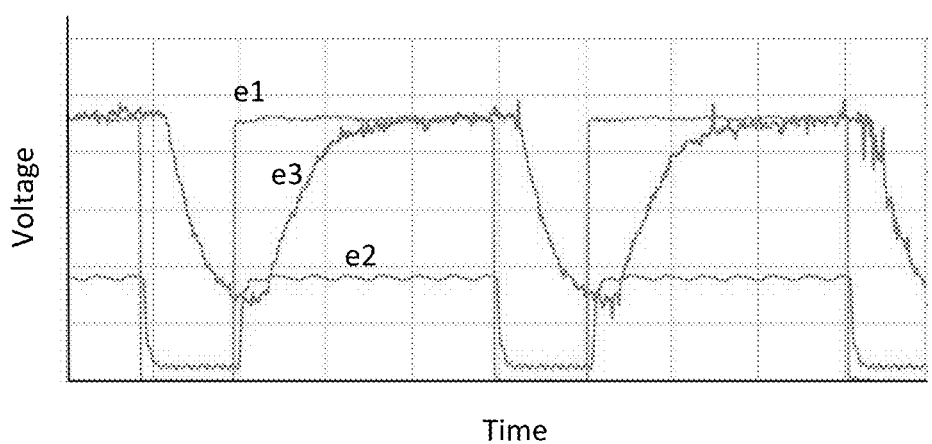

FIG. 4C illustrates a schematic data of an example operation of GCIB with a pulse train driving the ionizer in accordance with an embodiment.

In various embodiments, as described above, the ionizer may be powered with a pulse train that has a plurality of periodic pulses forming a square/rectangular waveform. In other embodiments, the pulse train may have other types of known waveform including triangular or sinusoidal waveform depending on the post processing algorithms used in the time of flight calculations.

A duty cycle of a pulse train may be used to increase or decrease a beam flux, and thereby for example an etch amount by GCIB, at predetermined wafer coordinates. For example, 100% duty cycle provides the maximum beam flux and 0% duty cycle provides zero beam flux. In one embodiment, an ionizer is powered by a LED drive by a pulse train with a frequency between 1 Hz and 10 kHz and a duty cycle between 50% and 100%, e.g., 75% duty cycle (e.g., 1.5 ms ON, 0.5 ms OFF at a frequency of 500 Hz). At an extraction plate in the ionizer, the voltage drop for ionization may also be measured. The LED drive voltage (curve e1), the extraction voltage (curve e2), and the beam current (curve e3) are illustrated in FIG. 4C.

Once the LED is turned OFF, the voltage at the extraction plate within the ionizer drops after a time delay of about 0.1 ms. A similar delay in the rise of voltage at the extraction plate may be observed when the LED is turned ON. This voltage delay may be used to compensate for the response time of the ionizer to the LED power.

The initially stable beam current decays around 0.1 ms after the ionizer is turned OFF, and reaches the lowest around 0.5 ms after the start of decay. The ionizer is then turned back ON. Similar to the first decay, the beam current starts around 0.1 ms after the ionizer is turned ON, and reaches the highest around 0.9 ms after the start of rise.

Over the subsequent pulses in the pulse train, the beam current shows a similar pattern of decay and rise with comparable delays. These multiple decays and rises may be collected to translate and overlap over the common pulse duration. By adding them to obtain a cumulative beam current decay and rise, the relative intensity of noises in the measured data may be reduced. In various embodiments, the frequency of a pulse train and duty ratio may be adjusted, which may influence factors such as the noise in the beam current, the beam flux, and the CSD in the GCIB.

FIG. 5 illustrates a GCIB processing tool according to an embodiment of this disclosure.

To perform the TOF analysis, in various embodiments, the GCIB equipment may be modified to add the capability of a high-speed data acquisition and data processing. Specifically, the signal from a beam current detector needs to be recorded with a current sensing system with a high-time resolution. In addition, as described below, one or more processors with a non-transitory memory storing a program with instructions to calculate TOF and CSD may be required.

Referring to FIG. 5, the main body of a GCIB processing system 500 may be housed in a vacuum vessel 502 comprising three communicating chambers, namely, a source chamber 504, an ionization/acceleration chamber 506, and a process chamber 508. The chambers may be evacuated to suitable operating pressures individually by vacuum pumping systems (not shown).

Gas clusters are formed in the source chamber 504. A source gas is introduced from a gas inlet 510 to the chamber 504 through a supersonic nozzle 512. A flow regulator 511 may regulate the flow of the gas through the gas inlet 510. A temperature controller 513 may be used to heat the gas to an appropriate temperature. Process parameters for gas cluster formation such as temperature, gas flow rates, and nozzle stagnation pressure may be controlled by the use of appropriate control systems (e.g., heaters and/or coolers, gas flow regulators, and pressure sensors) connected to the gas supply lines (not shown). In certain embodiments, the stagnation pressure may be between 70 to 500 kPa (525 Torr to $3.75 \times 10^3$ Torr). A skimmer aperture 514 is positioned downstream from the nozzle 512, and configured to partially deflect or skim a peripheral portion of the gas cluster jet. In certain embodiments, more than one nozzle may be configured in mutual close proximity in the source chamber 504, wherein the nozzles may be arranged to supply different gas mixtures to form a single GCIB. In certain embodiments, more than one skimmer may be used.

In the ionization/acceleration chamber 5o6, an ionizer 520 may be an electron ionization source comprising a metal filament, inductively coupled argon plasma source, or the like. The ionizer 520 may comprise an extraction plate 521, in which a voltage exerted for ionization may be measured, e.g., by a measurement circuit 523. Using the measurement circuit 523, a voltage response to an applied pulse at the ionizer, e.g., a drive pulse train may be measured. Accordingly, in various embodiments, a response time of the ionizer may be determined based on the voltage response and subsequently compensated from the TOF calculations.

In certain embodiments, the ionization may be performed with a voltage between 70 and 300 eV. In certain embodiments, the ionizer may further comprise a pulse generator to output a drive pulse train. In alternate embodiments, the pulse generator may be part of the control circuit of the system. In one embodiment, the ionizer 520 may be equipped with a LED drive power supply, a controller, a pulse width modulation (PWM) signal generator, and an extraction plate 521 that monitors the voltage extracted for ionization for the ion source (not shown). The use of a pulse train for driving the ionizer allows various process conditions. According to various embodiments of this disclosure, the duty ratio for a pulse train may take any value between 10 and 100%. The frequency of a pulse may be between 1

Hz and 10 kHz in one embodiment although in various embodiment the frequency of a pulse may have a different lower limit and/or upper limit. The operating state of the ionizer may be changed by toggling the LED drive power supply with the controller, and thereby causing the voltage change at the extraction plate 521.

In some embodiments, instead of the timing of the LED drive power supply toggling, the timing of voltage change at the extraction plate 521 may be used in the beam current analysis to calculate the TOF. This operation may advantageously compensate the response time of the ionizer to the LED drive power supply and provide a better accuracy in TOF analysis.

An accelerator 522 may be a set of biased electrodes, and configured to provide a set amount of kinetic energy to the gas clusters. In certain embodiments, the acceleration voltage may be between 30 and 80 keV.

A beam filter 524 is positioned after the accelerator 522 and configured to remove a portion of the GCIB according to the size of clusters. In certain embodiments, the beam filter 524 may be a magnetic filter or Wien filter, a device comprising of orthogonal electric and magnetic fields that can be used as a velocity filter to select a range of cluster sizes. A portion of GCIB may be deflected by the filter 524 to another trajectory from the main beam direction, and removed by a defining aperture 540. The degree of deflection for a cluster depends on its mass, and thereby enabling size filtering. In certain embodiments, the GCIB processing system 500 may also include a neutralizer (not shown) to neutralize the charge in the beam before the beam striking the substrate 542.

In the process chamber 508, a substrate 542 is mounted on a substrate holder 544 adequately positioned in the beam-line, and the substrate holder 544 is connected to a scanner (not shown). The scanner may move the position of the substrate relative to the beam-line in any direction in the plane perpendicular to the beam line. The scanner may also have the ability to change the incident angle of the beam.

The spot size of a gas cluster ion beam may vary from a few microns to a few centimeters. The process chamber may be kept in a high vacuum, for example, the pressure of process chamber may be kept at or below $2.0 \times 10^{-4}$ Pa ($1.5 \times 10^{-6}$ Torr).

A removable detector 546 is positioned in the path of the GCIB, and configured to receive the GCIB and measure the beam current. In certain embodiments, the detector 546 is a Faraday cup or the like, which collects charges carried by the GCIB. In certain embodiments, the detector 546 may replace the substrate 542 and substrate holder 544 or just the substrate 542. In such embodiments, the detector 546 may be removed after completion of the calibration phase. In alternative embodiments, the detector 546 may be similar to the substrate, for example, a wafer to be processed.

In various embodiments, the charges are measured by a current sensing system 552 connected to the detector 546 (or the substrate holder 544). The current sensing system 552 may be any suitable current sensing technique including transformer or coils based on induction, magnetic field based sensors, and other techniques. In one embodiment, the current sensing system 552 may be an oscilloscope with an analog front-end circuit. In various embodiments, the oscilloscope is configured to provide a sufficient bandwidth, for example greater than 50 kHz, to capture the fast beam current change in response to changing the operating state of the ionizer, particularly in the case of measurement with a pulse drive train.

Still in various embodiments, the digital signal is then provided to a high-speed acquisition capable hardware comprising a processor 554, a high speed buffer to buffer the digital signal, and a non-transitory memory 556 with a high write speed to store the digital signal connected through a high speed bus. The processor 554 may be programmed through a program with instructions, e.g., stored in the non-transitory memory 556, that when executed by the processor 554, may cause the processor 554 to process the digital signal of beam current to obtain a cluster size distribution (CSD) in the GCIB. The processor 554 upon execution of the program stored in a non-transitory memory 556 may directly instruct one or more units of the GCIB system such as the control systems for the nozzle 612 in the source chamber 504, the ionization/acceleration chamber 606, the flow regulator 511, and/or the temperature controller 513 to adjust one or more process parameters. Alternately, the processor 554 may send command signals to another hardware controller circuit that controls the operation of the control systems for the nozzle 612 in the source chamber 504, the ionization/acceleration chamber 606, the flow regulator 511, and/or the temperature controller 513. In various embodiments, the processor 554 or the hardware controller circuit may be connected to various components of the GCIB processing system 500 to adjust other process parameters. For example, the processor or the hardware controller circuit may also be connected to the scanner (not shown), the beam filter 624, the accelerator 622, the control systems for the nozzle 612, or combination thereof. In certain embodiments, one or more process parameters may be adjusted dynamically, i.e. during processing of the substrate, based on the cluster size distribution (CSD) information obtained in order to dynamically change the CSD. In one embodiment, information on the ratio of clusters to monomers may be used, in addition to or instead of CSD, to determine the adjustment of process parameters. In further embodiments, the one or more process parameters may be adjusted after processing the substrate. In some embodiments, the substrate 542 during the calibration phase may be a conductive Faraday cup, which is then replaced with the substrate to be processed with calibrated parameters.

FIG. 6A illustrates a method of processing a substrate in accordance with an embodiment of this disclosure. The method includes passing a gas cluster beam through an ionizer (box 602), for example, as described with respect to FIGS. 1 and 5. The ionizer has a first operating state in which the ionizer is turned ON to ionize the passing gas cluster beam and a second operating state in which the ionizer is turned OFF. The gas cluster beam comprising a distribution of clusters of different sizes and monomers, for example, as described with respect to FIG. 4A. The method further includes exposing a detector to the gas cluster beam (box 604) (e.g., FIG. 1, 5), measuring a beam current at the detector while changing an operating state of the ionizer (box 606) (e.g., FIG. 1, 3, 4A-4C, 5); obtaining time-of-flight information of the clusters and the monomers in the gas cluster beam based on the beam current and a timing of the changing of the operating state of the ionizer (box 608) (e.g., FIG. 1, 2, 3, 4A-4C, 5); obtaining size information relating to a size distribution of the clusters and the monomers in the gas cluster beam based on the time-of-flight information (box 61o) (e.g., FIG. 1, 2, 3, 4A-4C, 5); adjusting a process parameter of the gas cluster beam based on the size information (box 612) (e.g., FIG. 1, 5); and exposing the substrate to the gas cluster beam with the adjusted process parameter (box 614) (e.g., FIG. 1, 5).

FIG. 6B illustrates an alternate method of processing a substrate in accordance with an embodiment of this disclosure. The method includes applying, at an ionizer, a drive pulse train to an ion source to ionize a gas cluster beam and transfer the drive pulse train to the gas cluster beam (box 622) (e.g., FIG. 1, 4C, 5); measuring, at a detector exposed to the gas cluster beam, a beam current synchronously with the drive pulse train (box 624) (e.g., FIG. 1, 4C, 5); obtaining time-of-flight information of the clusters and the monomers in the gas cluster beam based on the beam current and the drive pulse train (box 626) (e.g., FIG. 1, 3, 4A-4C, 5); determining size information relating to a size distribution of clusters and monomers in the gas cluster ion beam based on the time-of-flight information (box 628) (e.g., FIG. 1, 2, 3, 4A-4C, 5); adjusting a process parameter of the gas cluster beam based on the size information (box 630) (e.g., FIG. 1, 5); and exposing the substrate to the gas cluster beam with the adjusted process parameter (box 632) (e.g., FIG. 1, 5).

Example embodiments of the invention are summarized here. Other embodiments can also be understood from the entirety of the specification as well as the claims filed herein.

Example 1. A method for processing a substrate that includes: passing a gas cluster beam through an ionizer, the ionizer having a first operating state in which the ionizer is turned ON to ionize the passing gas cluster beam and a second operating state in which the ionizer is turned OFF, the gas cluster beam including a distribution of clusters of different sizes and monomers; exposing a detector to the gas cluster beam; measuring a beam current at the detector while changing an operating state of the ionizer; obtaining time-of-flight information of the clusters and the monomers in the gas cluster beam based on the beam current and a timing of the changing of the operating state of the ionizer; obtaining size information relating to a size distribution of the clusters and the monomers in the gas cluster beam based on the time-of-flight information; adjusting a process parameter of the gas cluster beam based on the size information; and exposing the substrate to the gas cluster beam with the adjusted process parameter.

Example 2. The method of example 1, where the detector is another substrate.

Example 3. The method of one of examples 1 or 2, where changing the operating state of the ionizer includes changing from the first operating state to the second operating state, and where obtaining the size information includes measuring a decay in the beam current when the ionizer changes from the first operating state to the second operating state.

Example 4. The method of one of examples 1 to 3, where changing the operating state of the ionizer includes changing from the second operating state to the first operating state, and where obtaining the size information includes measuring an increase in the beam current when the ionizer changes from the second operating state to the first operating state.

Example 5. The method of one of examples 1 to 4, where obtaining the size information includes: calculating a time derivative of the beam current; and calculating the size distribution of the clusters and the monomers based on the time derivative of the beam current.

Example 6. The method of one of examples 1 to 5, where adjusting the process parameter of the gas cluster beam includes adjusting a process parameter for a nozzle generating the gas clusters, adjusting a process parameter of gases forming the gas clusters, adjusting a process parameter for the ionizer, adjusting a process parameter for accelerating ions in the gas cluster beam, or adjusting a process parameter for a tool moving the substrate relative to the gas cluster beam.

Example 7. The method of one of examples 1 to 6, where the size information includes a ratio of the clusters to the monomers.

Example 8. A method for processing a substrate that includes: applying, at an ionizer, a drive pulse train to an ion source to ionize a gas cluster beam and transfer the drive pulse train to the gas cluster beam; measuring, at a detector exposed to the gas cluster beam, a beam current synchronously with the drive pulse train; obtaining time-of-flight information of the clusters and the monomers in the gas cluster beam based on the beam current and the drive pulse train; determining size information relating to a size distribution of clusters and monomers in the gas cluster ion beam based on the time-of-flight information; adjusting a process parameter of the gas cluster beam based on the size information; and exposing the substrate to the gas cluster beam with the adjusted process parameter.

Example 9. The method of example 8, where the drive pulse train includes a plurality of pulses, each of the plurality of pulses having a time duration, and where determining the size information includes dividing the beam current into a plurality of beam current pulses, a duration of each of the plurality of beam current pulses is the time duration, and each of the plurality of beam current pulses is associated with one of the plurality of pulses, translating the plurality of beam current pulses to overlap over a common time duration, and adding the translated plurality of beam current pulses to obtain a cumulative beam current; and determining the size distribution from the cumulative beam current.

Example 10. The method of one of examples 8 or 9, further including measuring, at the ionizer, a voltage response to the drive pulse train, where determining the size information further includes compensating for a response time of the ionizer based on the voltage response.

Example 11. The method of one of examples 8 to 10, where obtaining the size information includes: calculating a time derivative of the beam current; and calculating the size distribution of the clusters and the monomers based on the time derivative of the beam current.

Example 12. The method of one of examples 8 to 11, where adjusting the process parameter of the gas cluster beam includes adjusting a process parameter for the ionizer.

Example 13. The method of one of examples 8 to 12, where adjusting the process parameter of the gas cluster beam includes adjusting a process parameter for a nozzle generating the gas clusters, adjusting a process parameter of gases forming the gas clusters, or adjusting a process parameter for accelerating ions in the gas cluster beam.

Example 14. The method of one of examples 8 to 13, where adjusting the process parameter of the gas cluster beam includes adjusting a process parameter for a tool moving the substrate relative to the gas cluster beam.

Example 15. An apparatus including: a source chamber having a beam-line for forming a gas cluster beam; an ionization/acceleration chamber including an ionizer configured to ionize the gas cluster beam and operate in a first operating state in which the ionizer is turned ON and a second operating state in which the ionizer is turned OFF, the gas cluster beam including a distribution of clusters of different sizes and monomers; a process chamber including a holder for holding a detector on the beam-line and expose the detector to the gas cluster beam and a current sensor to measure a beam current generated by the gas cluster beam at the detector while changing an operating state of the ionizer; a processor; and a non-transitory memory storing a program to be executed in the processor, the program including instructions to obtain size information relating to a size distribution of the clusters and the monomers in the gas cluster beam based on the beam current and a timing of the changing of the operating state of the ionizer, and adjust a process parameter of the gas cluster beam based on the size information.

Example 16. The apparatus of example 15, further including: a pulse generator to output a drive pulse train to the ionizer, the ionizer being configured to receive the drive pulse train and switch between the first operating state and the second operating state based on the drive pulse train.

Example 17. The apparatus of one of examples 15 or 16, where the ionizer includes an extraction plate, the apparatus further including: a measurement circuit to measure, at the extraction plate, a voltage response to the drive pulse train, where instructions to obtain the size information further includes instructions to compensate for a response time of the ionizer based on the voltage response.

Example 18. The apparatus of one of examples 15 to 17, where the detector is a Faraday cup.

Example 19. The apparatus of one of examples 15 to 18, further including a current sensor with an analog front-end circuit coupled to the detector to convert the beam current into a digital signal, where the digital signal is provided to the processor.

Example 20. The apparatus of one of examples 15 to 19, further including a control circuit to receive the process parameter and send a command signal to the source chamber, the command signal including information relating to a change a process recipe for the source chamber in forming the gas cluster beam.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:
    passing a gas cluster beam through an ionizer, the ionizer having a first operating state in which the ionizer is turned ON to ionize the passing gas cluster beam and a second operating state in which the ionizer is turned OFF, the gas cluster beam comprising a distribution of clusters of different sizes and monomers;
    exposing a detector to the gas cluster beam;
    measuring a beam current at the detector while changing an operating state of the ionizer;
    obtaining time-of-flight information of the clusters and the monomers in the gas cluster beam based on the beam current and a timing of the changing of the operating state of the ionizer;
    obtaining size information relating to a size distribution of the clusters and the monomers in the gas cluster beam based on the time-of-flight information;
    adjusting a process parameter of the gas cluster beam based on the size information; and
    exposing the substrate to the gas cluster beam with the adjusted process parameter.

2. The method of claim 1, wherein the detector is another substrate.

3. The method of claim 1, wherein changing the operating state of the ionizer comprises changing from the first operating state to the second operating state, and wherein obtaining the size information comprises measuring a decay in the beam current when the ionizer changes from the first operating state to the second operating state.

4. The method of claim 1, wherein changing the operating state of the ionizer comprises changing from the second operating state to the first operating state, and wherein obtaining the size information comprises measuring an increase in the beam current when the ionizer changes from the second operating state to the first operating state.

5. The method of claim 1, wherein obtaining the size information comprises:
    calculating a time derivative of the beam current; and
    calculating the size distribution of the clusters and the monomers based on the time derivative of the beam current.

6. The method of claim 1, wherein adjusting the process parameter of the gas cluster beam comprises adjusting a process parameter for a nozzle generating the gas clusters, adjusting a process parameter of gases forming the gas clusters, adjusting a process parameter for the ionizer, adjusting a process parameter for accelerating ions in the gas cluster beam, or adjusting a process parameter for a tool moving the substrate relative to the gas cluster beam.

7. The method of claim 1, wherein the size information comprises a ratio of the clusters to the monomers.

8. A method for processing a substrate, the method comprising:
    applying, at an ionizer, a drive pulse train to an ion source to ionize a gas cluster beam and transfer the drive pulse train to the gas cluster beam;
    measuring, at a detector exposed to the gas cluster beam, a beam current synchronously with the drive pulse train;
    obtaining time-of-flight information of the clusters and the monomers in the gas cluster beam based on the beam current and the drive pulse train;
    determining size information relating to a size distribution of clusters and monomers in the gas cluster ion beam based on the time-of-flight information;
    adjusting a process parameter of the gas cluster beam based on the size information; and
    exposing the substrate to the gas cluster beam with the adjusted process parameter.

9. The method of claim 8,
    wherein the drive pulse train comprises a plurality of pulses, each of the plurality of pulses having a time duration, and
    wherein determining the size information comprises
        dividing the beam current into a plurality of beam current pulses, a duration of each of the plurality of beam current pulses is the time duration, and each of the plurality of beam current pulses is associated with one of the plurality of pulses,
        translating the plurality of beam current pulses to overlap over a common time duration, and
        adding the translated plurality of beam current pulses to obtain a cumulative beam current; and
    determining the size distribution from the cumulative beam current.

10. The method of claim 8, further comprising
    measuring, at the ionizer, a voltage response to the drive pulse train, wherein determining the size information further comprises compensating for a response time of the ionizer based on the voltage response.

11. The method of claim 8, wherein obtaining the size information comprises:
calculating a time derivative of the beam current; and
calculating the size distribution of the clusters and the monomers based on the time derivative of the beam current.

12. The method of claim 8, wherein adjusting the process parameter of the gas cluster beam comprises adjusting a process parameter for the ionizer.

13. The method of claim 8, wherein adjusting the process parameter of the gas cluster beam comprises adjusting a process parameter for a nozzle generating the gas clusters, adjusting a process parameter of gases forming the gas clusters, or adjusting a process parameter for accelerating ions in the gas cluster beam.

14. The method of claim 8, wherein adjusting the process parameter of the gas cluster beam comprises adjusting a process parameter for a tool moving the substrate relative to the gas cluster beam.

15. An apparatus comprising:
a source chamber having a beam-line for forming a gas cluster beam;
an ionization/acceleration chamber comprising an ionizer configured to ionize the gas cluster beam and operate in a first operating state in which the ionizer is turned ON and a second operating state in which the ionizer is turned OFF, the gas cluster beam comprising a distribution of clusters of different sizes and monomers;
a process chamber comprising a holder for holding a detector on the beam-line and expose the detector to the gas cluster beam and a current sensor to measure a beam current generated by the gas cluster beam at the detector while changing an operating state of the ionizer;
a processor; and
a non-transitory memory storing a program to be executed in the processor, the program comprising instructions to
obtain size information relating to a size distribution of the clusters and the monomers in the gas cluster beam based on the beam current and a timing of the changing of the operating state of the ionizer, and
adjust a process parameter of the gas cluster beam based on the size information.

16. The apparatus of claim 15, further comprising:
a pulse generator to output a drive pulse train to the ionizer, the ionizer being configured to receive the drive pulse train and switch between the first operating state and the second operating state based on the drive pulse train.

17. The apparatus of claim 15, wherein the ionizer comprises an extraction plate, the apparatus further comprising:
a measurement circuit to measure, at the extraction plate, a voltage response to the drive pulse train, wherein instructions to obtain the size information further comprises instructions to compensate for a response time of the ionizer based on the voltage response.

18. The apparatus of claim 15, wherein the detector is a Faraday cup.

19. The apparatus of claim 15, further comprising a current sensor with an analog front-end circuit coupled to the detector to convert the beam current into a digital signal, wherein the digital signal is provided to the processor.

20. The apparatus of claim 15, further comprising a control circuit to receive the process parameter and send a command signal to the source chamber, the command signal comprising information relating to a change a process recipe for the source chamber in forming the gas cluster beam.

* * * * *